United States Patent
Yang et al.

(10) Patent No.: US 9,412,818 B2
(45) Date of Patent: Aug. 9, 2016

(54) SYSTEM AND METHOD OF MANUFACTURING A FIN FIELD-EFFECT TRANSISTOR HAVING MULTIPLE FIN HEIGHTS

(71) Applicant: QUALCOMM Incorporated, San Diego, CA (US)

(72) Inventors: Bin Yang, San Diego, CA (US); Xia Li, San Diego, CA (US); PR Chidambaram, San Diego, CA (US); Choh Fei Yeap, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 134 days.

(21) Appl. No.: 14/100,489

(22) Filed: Dec. 9, 2013

(65) Prior Publication Data

US 2015/0162404 A1    Jun. 11, 2015

(51) Int. Cl.
| | |
|---|---|
| H01L 27/088 | (2006.01) |
| H01L 29/06 | (2006.01) |
| H01L 29/78 | (2006.01) |
| H01L 29/66 | (2006.01) |
| H01L 29/20 | (2006.01) |
| H01L 29/22 | (2006.01) |
| H01L 21/8234 | (2006.01) |

(52) U.S. Cl.
CPC .... *H01L 29/0684* (2013.01); *H01L 21/823431* (2013.01); *H01L 27/0886* (2013.01); *H01L 29/0657* (2013.01); *H01L 29/20* (2013.01); *H01L 29/22* (2013.01); *H01L 29/66795* (2013.01); *H01L 29/785* (2013.01)

(58) Field of Classification Search
USPC ........................................ 257/401
See application file for complete search history.

(56) References Cited

U.S. PATENT DOCUMENTS

| | | | |
|---|---|---|---|
| 7,098,477 B2 * | 8/2006 | Zhu et al. .......... | 257/66 |
| 8,361,894 B1 | 1/2013 | Hargrove et al. | |
| 8,445,334 B1 * | 5/2013 | Basker ........ | H01L 29/6656 |
| | | | 257/E21.415 |
| 8,445,963 B2 | 5/2013 | Jakschik et al. | |
| 2007/0045765 A1 * | 3/2007 | Brar et al. ......... | 257/481 |
| 2007/0218628 A1 | 9/2007 | Orlowski et al. | |
| 2008/0048173 A1 * | 2/2008 | Sadaka et al. ........ | 257/18 |
| 2008/0122013 A1 | 5/2008 | Schepis et al. | |
| 2008/0128797 A1 | 6/2008 | Dyer et al. | |
| 2009/0057780 A1 * | 3/2009 | Wong et al. .......... | 257/401 |
| 2010/0167537 A1 * | 7/2010 | Aton ................ | 438/674 |
| 2011/0051535 A1 | 3/2011 | Song et al. | |
| 2011/0062466 A1 * | 3/2011 | Tanaka et al. ........ | 257/94 |
| 2011/0180847 A1 | 7/2011 | Ikeda et al. | |
| 2013/0062672 A1 * | 3/2013 | Zhu et al. ........... | 257/288 |
| 2013/0161756 A1 * | 6/2013 | Glass et al. ......... | 257/369 |
| 2014/0035041 A1 * | 2/2014 | Pillarisetty et al. ..... | 257/365 |

OTHER PUBLICATIONS

Pode, Ramchandra et al. "Solar Lighting", Springer-Verlag London Limited, 2011. ISBN: 9781447121343.*
Neuberger, M, "III-V Semiconducting Compounds", Springer US, 1971, Boston, MA, ISBN: 9781461596066.*

(Continued)

*Primary Examiner* — Andy Huynh
*Assistant Examiner* — Sitaramarao S Yechuri
(74) *Attorney, Agent, or Firm* — Toler Law Group, PC (57) ABSTRACT

An apparatus comprises a first fin field effect transistor (FinFET) device extending from a surface of a first etch stop layer. The apparatus also comprises a second FinFET device extending from a surface of a second etch stop layer. A first compound layer is interposed between the first etch stop layer and the second etch stop layer.

28 Claims, 6 Drawing Sheets

(56) References Cited

OTHER PUBLICATIONS

International Search Report and Written Opinion for International Application No. PCT/US2014/067449, ISA/EPO, Date of Mailing May 8, 2015, 16 pages Communication Relating to the Results of the Partial International Search for International Application No. PCT/US2014/067449, ISA/EPO, Date of Mailing Feb. 6, 2015, 5 pages.

* cited by examiner

SYSTEM AND METHOD OF MANUFACTURING A FIN FIELD-EFFECT TRANSISTOR HAVING MULTIPLE FIN HEIGHTS

I. FIELD

The present disclosure is generally related to transistors.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

An electronic device (e.g., a wireless phone or a computing device) may include a fin-type semiconductor device as a component. A fin-type semiconductor device is a semiconductor device that has narrow protruding "fins" formed into the semiconductor device. An example of a fin-type semiconductor device is a fin field-effect transistor (FinFET). A fin of a FinFET may be a fin-shaped semiconductor structure that enables formation of a conducting channel.

Existing FinFET manufacturing processes have difficulty manufacturing FinFETs with an aspect ratio (a ratio between fin height and fin width) greater than three due to imprecise etching. Further, when the aspect ratio is greater than three, angled implants of the fin become uneven. Some limiting factors include precision of etching of the fin height and/or fin width, decreasing implant angles at higher aspect ratios, and leakage current control at greater aspect ratios. Designing a circuit using FinFETs with limited aspect ratios may reduce design options as compared to a design using FinFETs with a greater range of aspect ratios.

III. SUMMARY

Systems and methods of manufacturing a fin-type semiconductor device (e.g., a FinFET) that has multiple fin heights are disclosed. When a fin-type semiconductor device is manufactured, the described techniques may selectively form fins of the fin-type semiconductor device so that the fins have different fin heights. During manufacturing of a fin-type semiconductor device, multiple etch stop layers and compound layers may be formed. For example, a first etch stop layer may be formed on a surface of a substrate. A first compound layer may be formed on a surface of the first etch stop layer. A second etch stop layer may be formed on a surface of the first compound layer. A second compound layer may be formed on a surface of the second etch stop layer.

The first etch stop layer and the second etch stop layer may be formed using a first material having a first band gap energy. The first compound layer and the second compound layer may be formed using a second material having a second band gap energy that is less than the first band gap energy. For example, the first material may be a first group III-V compound (e.g., Aluminum Arsenide (AlAs), Indium Aluminum Arsenide (InAlAs)) and the second material may be a second group III-V compound (e.g., Gallium Arsenide (GaAs), Indium Gallium Arsenide (InGaAs)). As another example, the first material may be a first group II-VI compound and the second material maybe a second group II-VI material. A typical II-VI channel material may include materials such as CdTe or CdSe, CdS. A typical II-VI barrier layer material may include materials such as ZnTe; ZnSe, ZnS.

A first FinFET device and a second FinFET device may be formed from the etch stop layers and the compound layers. For example, the first FinFET device may have a first fin that is formed from regions of the second compound layer and the first compound layer via an etching process. A first region of the second etch stop layer may be patterned to form an intermediate layer that is interposed between the first fin layer and the second fin layer. A second region of the second compound layer may be patterned to from a second fin of a second FinFET. The fin of the first FinFET device may have a different fin height than the fin of the second FinFET device. By selectively etching individual fins to the first etch stop layer or to the second etch stop layer, a variety of fin heights may be formed. Because the etch stop layers regulate fin heights, increased aspect ratios (e.g., aspect ratios greater than 3) of fins may be achieved with enhanced control.

In a particular embodiment, an apparatus comprises a first fin field effect transistor (FinFET) device extending from a surface of a first etch stop layer. The apparatus also comprises a second FinFET device extending from a surface of a second etch stop layer. A first compound layer is interposed between the first etch stop layer and the second etch stop layer.

In another particular embodiment, a method comprises forming a first fin field effect transistor (FinFET) device that extends from a surface of a first etch stop layer. The method also comprises forming a second FinFET device that extends from a surface of a second etch stop layer. A first compound layer is interposed between the first etch stop layer and the second etch stop layer.

One particular advantage provided by at least one of the disclosed embodiments is an ability to manufacture a fin-type semiconductor device having an aspect ratio that is greater than three. A circuit may be designed using fin-type semiconductor devices having aspect ratios greater than three. Thus, design options may be increased as compared to designing a circuit using fin-type semiconductor devices with limited aspect ratios (e.g., equal or less than three). Other aspects, advantages, and features of the present disclosure will become apparent after review of the entire application, including the following sections: Brief Description of the Drawings, Detailed Description, and the Claims.

V. DETAILED DESCRIPTION

Figure 1:
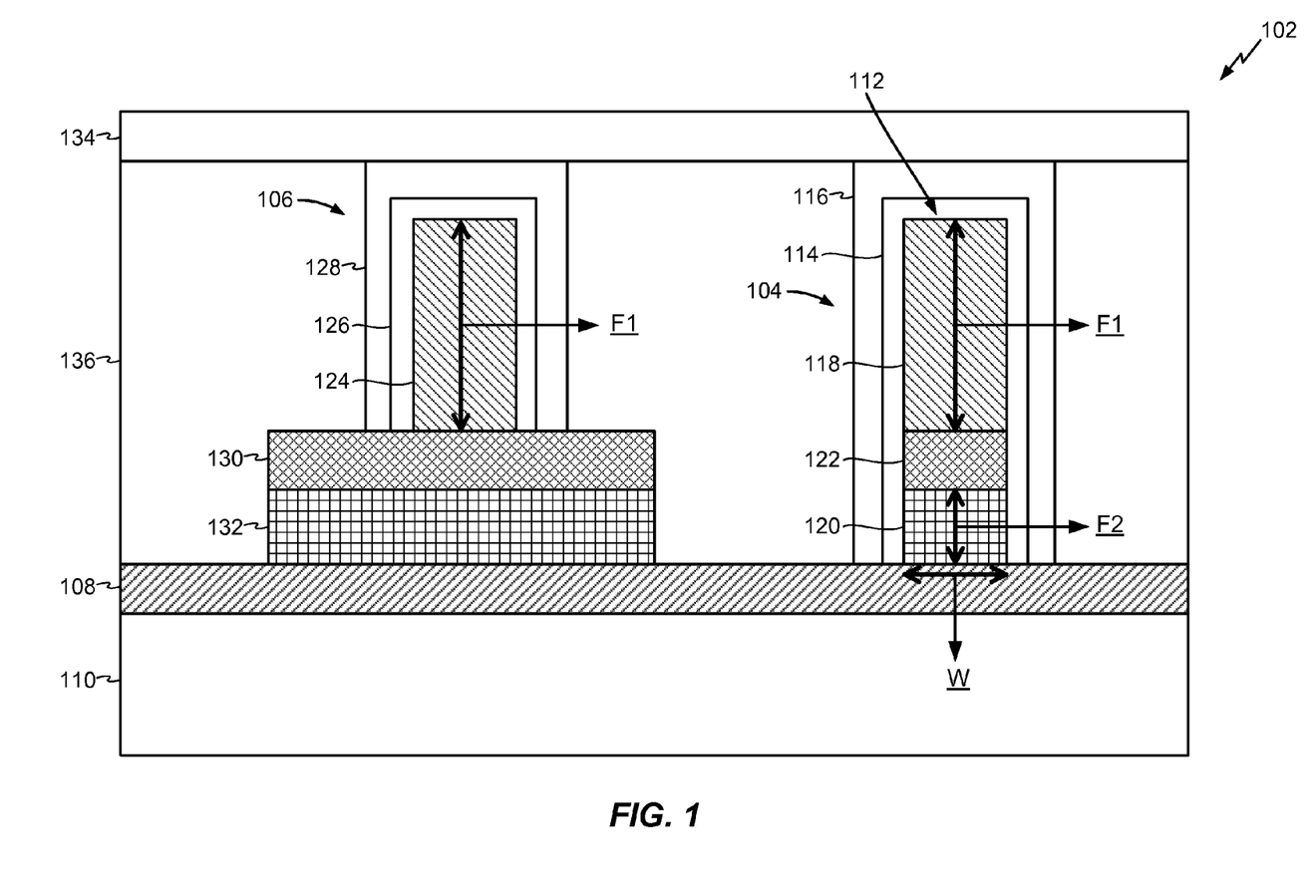
FIG. 1 is a diagram of a particular illustrative embodiment of a fin-type semiconductor device with fins having different effective fin heights.

FIG. 1 is a diagram of a particular illustrative embodiment of a fin-type semiconductor device 102 (e.g., a Fin field-effect transistor (FinFET)) with fins having different effective fin heights. The fin-type semiconductor device 102 may include a first etch stop layer 108 that is formed on a surface of a substrate 110. The fin-type semiconductor device 102 may also include a first FinFET 104 and a second FinFET 106. The first FinFET 104 and the second FinFET 106 may be located within an interlayer dielectric (ILD) layer 136. The first FinFET 104 and the second FinFET 106 may be adjacent to a capacitive film layer 134.

The first FinFET 104 may extend from a surface of the first etch stop layer 108. The first FinFET 104 may include a plurality of components. For example, the first FinFET 104 may include a first fin 112, a first oxide layer 114, and a first metal gate 116. The first fin 112 may include a first fin layer 118, a second fin layer 120, and an intermediate layer 122 that is interposed between the first fin layer 118 and the second fin layer 120. The intermediate layer 122 may be formed from a layer of a second etch stop layer material. The second FinFET 106 may extend from a surface of a region 130 of the second etch stop layer material. A region 132 may be interposed between the region 130 and the first etch stop layer 108. The second FinFET 106 may include a second fin 124, a second oxide layer 126, and a second metal gate 128.

The first fin layer 118, the second fin layer 120, and the second fin 124 may be formed using a first III-V compound, a first II-VI compound, or other type of compounds (e.g., compound material formed using elements in groups III and V or groups II and VI of the periodic table). The intermediate layer 122 and the region 130 may be formed using a second III-V compound that has higher band gap energy (e.g., energy needed to free an outer shell electron from the electron's orbit to become a mobile charge carrier) than the first III-V compound. Due to the higher band gap energy of the second III-V compound, the intermediate layer 122 and the region 130 may act as dielectric layers to reduce leakage current of the first FinFET 104 and of the second FinFET 106, respectively. As an example, the first III-V compound may include aluminum arsenide (AlAs) and the second III-V compound may include gallium arsenide (GaAs). As another example, the first III-V compound may include indium AlAs (InAlAs) and the second III-V compound may include indium GaAs (InGaAs). As another example, the first II-VI compound may include CdTe as fin layers 118, 120, and as the second fin 124, and ZnTe as the region 130.

In another embodiment, the first fin layer 118, the second fin layer 120, and the second fin 124 may be doped uniformly by new doping techniques, such as Atomic Layer Doping, that are not limited by an aspect ratio, and that may dope the fin more uniformly on a 3D fin than the conventional angled implant doping technique. Therefore, by using material with a high carrier mobility (e.g., GaAs) to form at least a part of a fin, angled implants of dopants into sidewalls of the first fin 112 and/or the second fin 124 may be avoided. In another embodiment, the first fin layer 118, the second fin layer 120, and the second fin 124 may be formed using a first II-VI compound, and the intermediate layer 122 and the region 130 may be formed using a second II-VI compound that has higher band gap energy than the first II-VI compound.

Because carrier conduction in the first FinFET 104 occurs primarily in the first fin layer 118 and the second fin layer 120, the first FinFET 104 may have an "effective" first fin height that is equal to a sum of a height of the first fin layer 118, F1, and a height of the second fin layer 120, F2. The second FinFET 106 may have a second fin height that is equal to a height of the second fin 124. The height of the second fin 124 may be the same as the height of the first fin layer 118, F1. The first FinFET 104 and the second FinFET 106 may have the same fin width, W. The fin-type semiconductor device 102 may have an effective device width, Dev_Width, that is equal to a sum of the first fin height, the second fin height, and the fin width for comparison to a channel width of a planar device. During manufacturing, each fin (e.g. the first fin 112 and the second fin 124) may be selected as having an effective height of the first fin height or the second fin height. Hence, the first FinFET 104 and the second FinFET 106 may have different aspect ratios. Thus, the fin-type semiconductor device 102 may provide different FinFET aspect ratios to suite a design parameter of a resulting semiconductor device by using one or more etch stop layers (e.g., the first etch stop layer 108) to control the amount of etching needed to define the fin heights of the fin-type semiconductor device 102.

Figure 2:
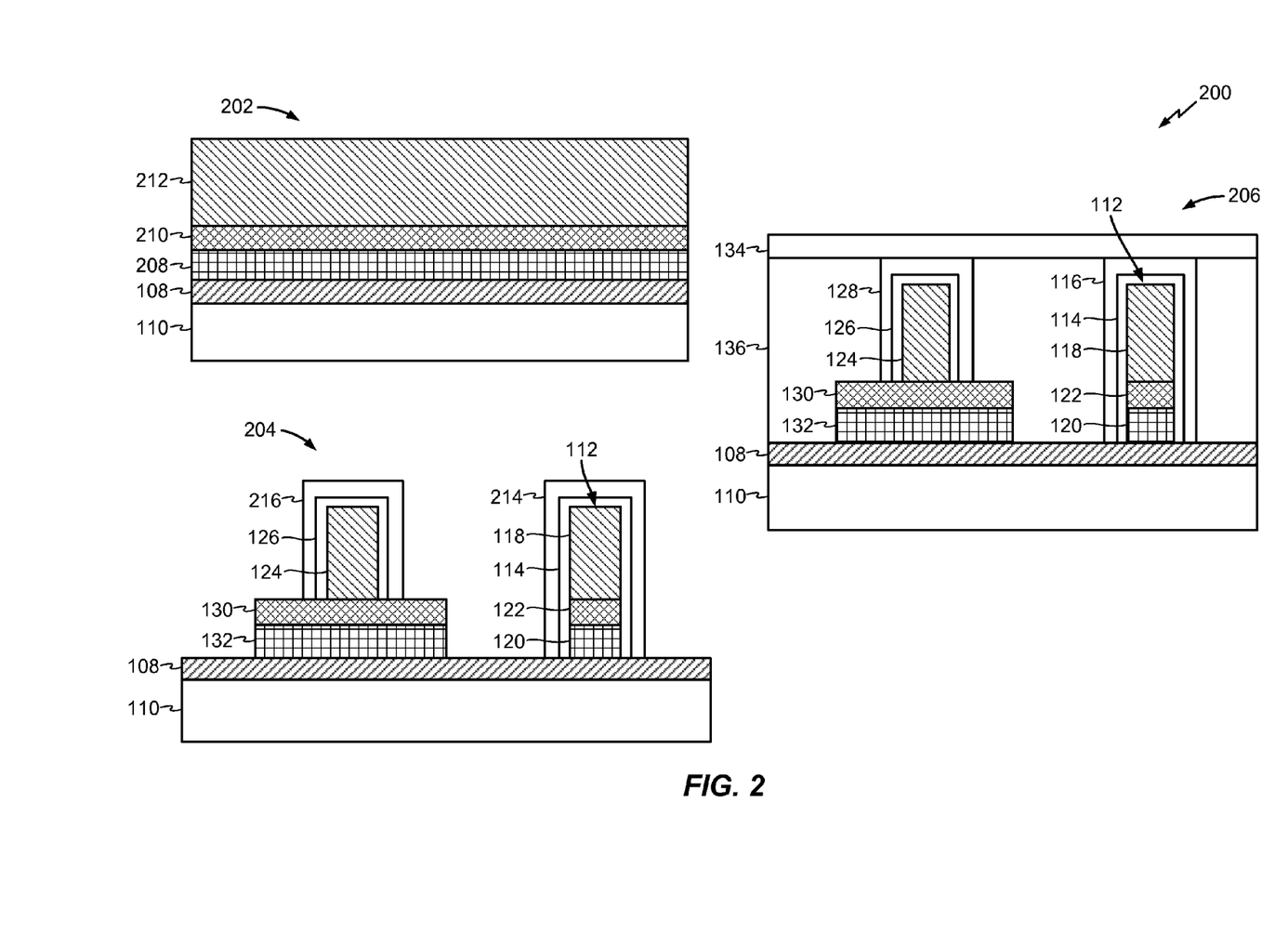
FIG. 2 is a diagram of a particular illustrative embodiment of a portion of a process to manufacture the fin-type semiconductor device of FIG. 1.

FIG. 2 is a diagram of a particular illustrative embodiment of a portion of a process 200 to manufacture the fin-type semiconductor device 102 of FIG. 1. At a first processing stage 202, the first etch stop layer 108 may be formed on a surface of the substrate 110 via epitaxial growth. A first compound layer 208 may be formed on a surface of the first etch stop layer 108 via epitaxial growth. A second etch stop layer 210 may be formed on a surface of the first compound layer 208 via epitaxial growth. A second compound layer 212 may be formed on a surface of the second etch stop layer 210 via epitaxial growth. The first etch stop layer 108 and the second etch stop layer 210 may serve as stopping points during an etching process to define a fin height of the fin-type semiconductor device 102.

At a second processing stage 204, the second compound layer 212 may be etched down to the second etch stop layer 210 to form the first fin layer 118 and the second fin 124. Because the second etch stop layer 210 is made from a different material than the second compound layer 212, an etching process (e.g., a chemical etching process) applied to the second compound layer 212 is not effective on the second etch stop layer 210 (e.g., the second etch stop layer 210 is not etched by the etching process applied to the second compound layer 212). The second etch stop layer 210 may serve to define the amount of etching performed with respect to the second compound layer 212. The second etch stop layer 210 and the first compound layer 208 may be etched down to the first etch stop layer 108 to form the region 130, the intermediate layer 122, the region 132, and the second fin layer 120. The second etch stop layer 210 may be etched by a different etching process than the first compound layer 208 so that the first etch stop layer 108 may serve as a stopping point for the etching process applied to the first compound layer 208.

By controlling thickness of the first compound layer 208 and the second compound layer 212, a respective effective fin height of the first FinFET 104 and the second FinFET 106 may be controlled. Alternatively, by controlling the depth of etching of the compound layers 208, 212 and/or the etch stop layers 108, 210, the respective effective fin height of the first FinFET 104 and the second FinFET 106 may also be controlled. The first oxide layer 114 and the second oxide layer 126 may be formed via a film deposition process and an etching process. By using the etch stop layers 108, 210 to control effective fin heights, larger aspect ratios may be achieved and variance of effective fin heights in different fin-type semiconductor devices may be reduced. Further, by forming the first fin 112 and the second fin 124 with conductive material (e.g., III-V compounds, II-IV compounds, etc.), the use of angled implants of the fins 112, 124 may be avoided.

A first dummy poly gate 214 may be formed on a surface of the first fin 112 and a second dummy poly gate 216 may be formed on a surface of the second fin 124 via a film deposition process and an etching process. Dummy poly gates 214 and 216, a source region (not shown) and a drain region (not shown) may be formed via epitaxial growth. With regards to FIG. 2, the source and drain regions may be on the fin 112. The middle of the fin 112 may be covered by the gate.

At a third processing stage 206, the ILD layer 136 may be formed via a film deposition process and a chemical-mechanical polishing (CMD) process. The dummy poly gates 214 and 216, and the dummy oxide 114, 126 may be removed from the surfaces of the fin 118, 122, 120, 124, via a selective etching processing to stop on the fin layer 118 without damaging any part of the fin 112. The etching may be followed by interfacial oxide layer growth, Hi-K oxide (such as HfO2) deposition, and metal gate deposition (such as TiN, MN, Al, and W). The above processes form the first metal gate 116 and the second metal gate 128, respectively. The first metal gate 116 and the second metal gate 128 may be formed via a film and metals deposition process, such as atomic layer deposition (known as ALD). The capacitive film layer 134 may be formed via a film deposition process.

Figure 3:
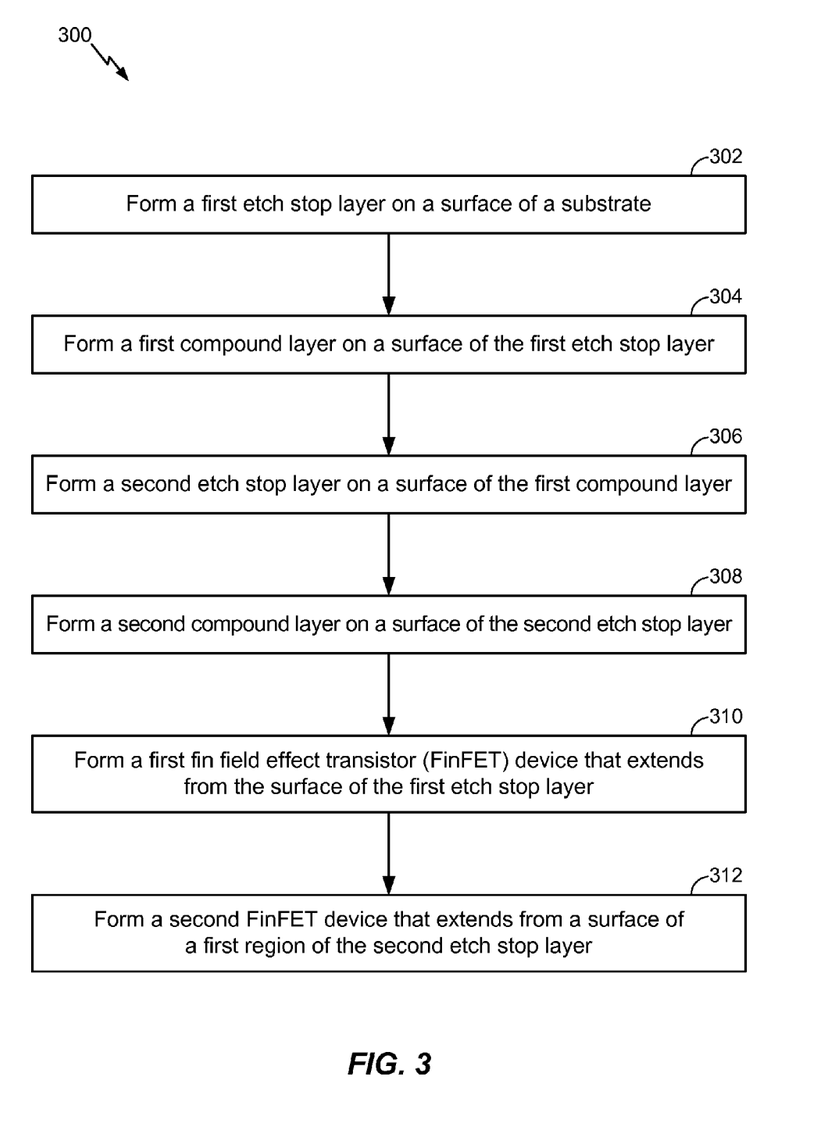
FIG. 3 is a flow chart of a particular illustrative embodiment of a method of manufacturing a fin-type semiconductor device having different effective fin heights.

Referring to FIG. 3, a particular illustrative embodiment of a method 300 of manufacturing a fin-type semiconductor device having different effective fin heights is disclosed. In an illustrative embodiment, the method 300 may be performed to manufacture the fin-type semiconductor device 102 of FIG. 1 and may be illustrated with reference to FIG. 2.

The method 300 includes forming a first etch stop layer on a surface of a substrate, at 302. For example, the first etch stop layer 108 may be formed on the substrate 110, as described with reference to FIG. 2.

The method 300 also includes forming a first compound layer on a surface of the first etch stop layer, at 304. For example, the first compound layer 208 may be formed on a surface of the first etch stop layer 108, as described with reference to FIG. 2.

The method 300 further includes forming a second etch stop layer on a surface of the first compound layer, at 306. For example, the second etch stop layer 210 may be formed on a surface of the first compound layer 208, as described with reference to FIG. 2.

The method 300 also includes forming a second compound layer on a surface of the second etch stop layer, at 308. For example, the second compound layer 212 may be formed on a surface of the second etch stop layer 210, as described with reference to FIG. 2.

The method 300 further includes forming a first fin field effect transistor (FinFET) device that extends from the surface of the first etch stop layer, at 310. For example, the first FinFET 104 may be formed to extend from the surface of the first etch stop layer 108, as described with reference to FIG. 2.

The method 300 also includes forming a second FinFET device that extends from a surface of a first region of the second etch stop layer (e.g., pattern the second compound layer to form a second fin of the second FinFET device), at 312. For example, the second FinFET 106 may be formed to extend from a surface of the region 130 of the second etch stop layer 210, as described with reference to FIG. 2. After the fin-type semiconductor device 102 is formed, the fin-type semiconductor device 102 may be incorporated into other devices (e.g., a processor).

Figure 4:
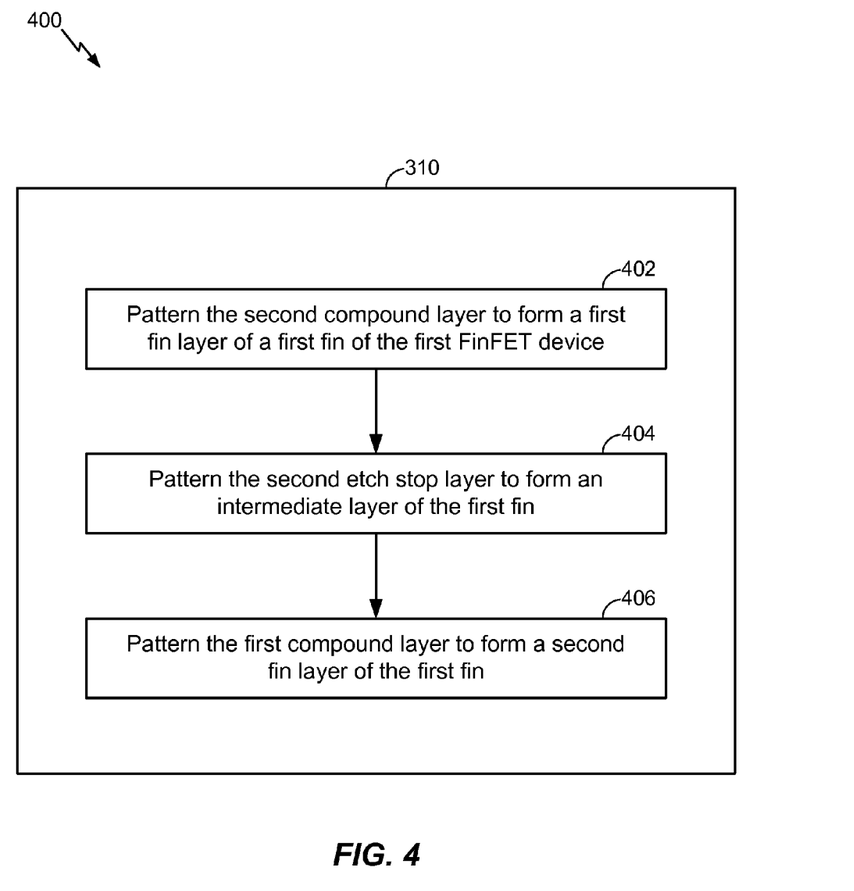
FIG. 4 is a flow chart of another illustrative embodiment of a method of manufacturing a fin-type semiconductor device having different effective fin heights.

Referring to FIG. 4, another illustrative embodiment of a method 400 of manufacturing a fin-type semiconductor device having different effective fin heights is disclosed. In a particular embodiment, the method 400 may correspond to the step 310 of FIG. 3.

The method 400 includes patterning the second compound layer to form a first fin layer of the first fin of the first FinFET, at 402. For example, the second compound layer 212 may be patterned to form the first fin layer 118 of the first fin 112 of the first FinFET 104, as described with reference to FIG. 2.

The method 400 also includes patterning the second etch stop layer to form an intermediate layer of the first fin, at 404. For example, the second etch stop layer 210 may be patterned to form the intermediate layer 122 of the first fin 112, as described with reference to FIG. 2.

The method 400 further includes patterning the first compound layer to form a second fin layer of the first fin, at 406. For example, the first compound layer 208 may be patterned to form the second fin layer 120 of the first fin 112, as described with reference to FIG. 2. Subsequently, the method 400 may be used to manufacture another FinFET device.

Figure 5:
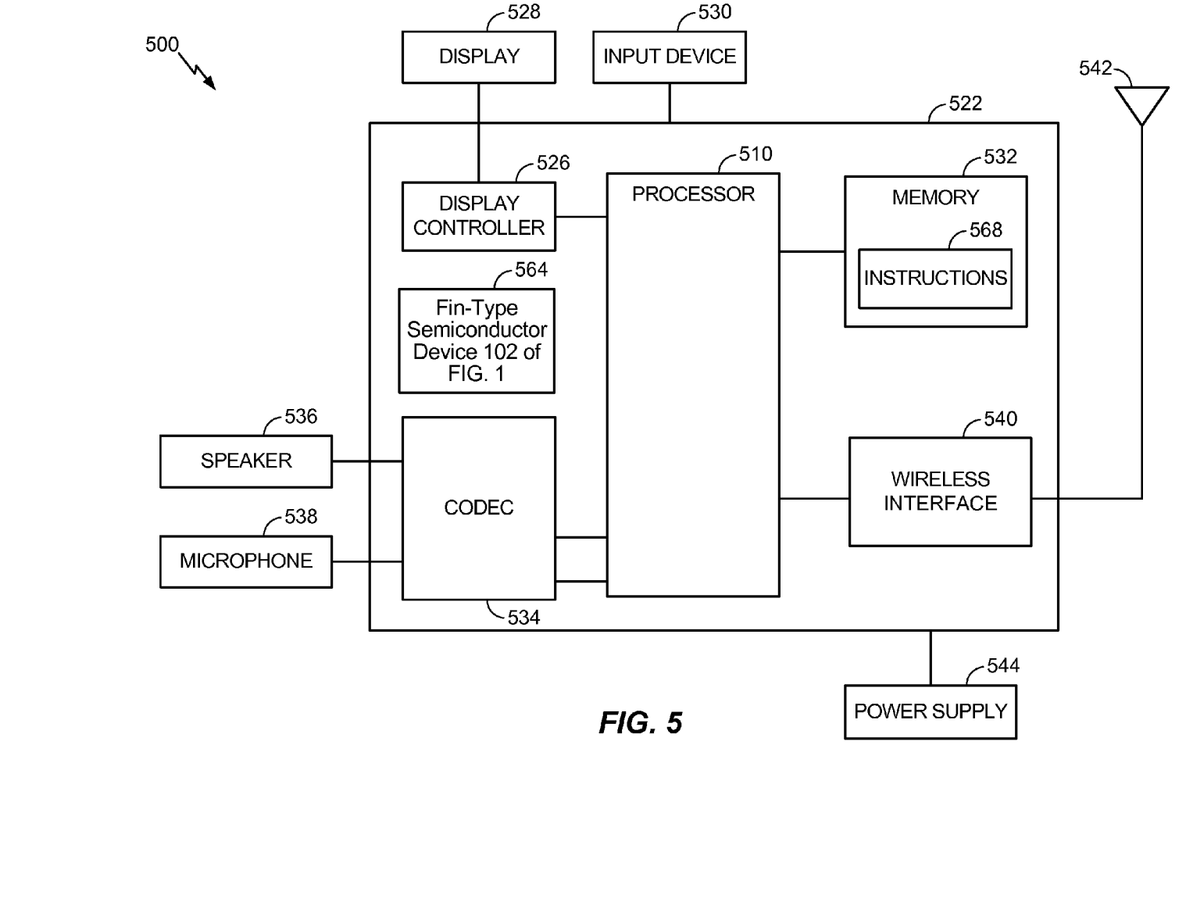
FIG. 5 is a block diagram of a device that includes a fin-type semiconductor device with fins having different effective fin heights.

Referring to FIG. 5, a block diagram of a particular illustrative embodiment of a wireless communication device 500 is depicted. The device 500 may include, or have incorporated therein, the fin-type semiconductor device 102 of FIG. 1.

The device 500 includes a processor 510 (e.g., a digital signal processor (DSP), a central processing unit (CPU), etc.) coupled to a memory 532. The memory 532 includes instructions 568 (e.g., executable instructions) such as computer-readable instructions that are readable by the processor 510. The instructions 568 may include one or more instructions that are executable by a computer, such as the processor 510.

FIG. 5 also shows a display controller 526 that is coupled to the processor 510 and to a display 528. A coder/decoder (CODEC) 534 may also be coupled to the processor 510. A speaker 536 and a microphone 538 may be coupled to the CODEC 534. FIG. 5 also indicates that a wireless interface 540 may be coupled to the processor 510 and to an antenna 542. The wireless interface 540 may include a wireless controller, a wireless transceiver, such as a receiver circuit, a transmitter circuit, or a combination thereof.

In a particular embodiment, the processor 510, the display controller 526, the memory 532, the CODEC 534, and the wireless interface 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

The device 500 may also include a device 564. The device 564 may correspond to the fin-type semiconductor device 102 of FIG. 1. One or more components of the device 500 may be implemented using the device 564. For example, the processor 510, the memory 532, the display controller 526, etc. may include circuits that include devices such as the device 564. For example, the device 564 may be used to implement, or included in, other devices, such as an analog circuit, a digital circuit, a mixed-signal circuit, a radio frequency (RF) circuit, a clock signal generation circuit, a memory device (e.g., a dynamic random access memory (DRAM) device), another type of device, or any combination thereof.

One or more of the disclosed embodiments may be implemented in a system or an apparatus, such as the device 500, that may include a communications device, a fixed location data unit, a mobile location data unit, a mobile phone, a cellular phone, a satellite phone, a computer, a tablet, a portable computer, or a desktop computer. Additionally, the device 500 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 6:
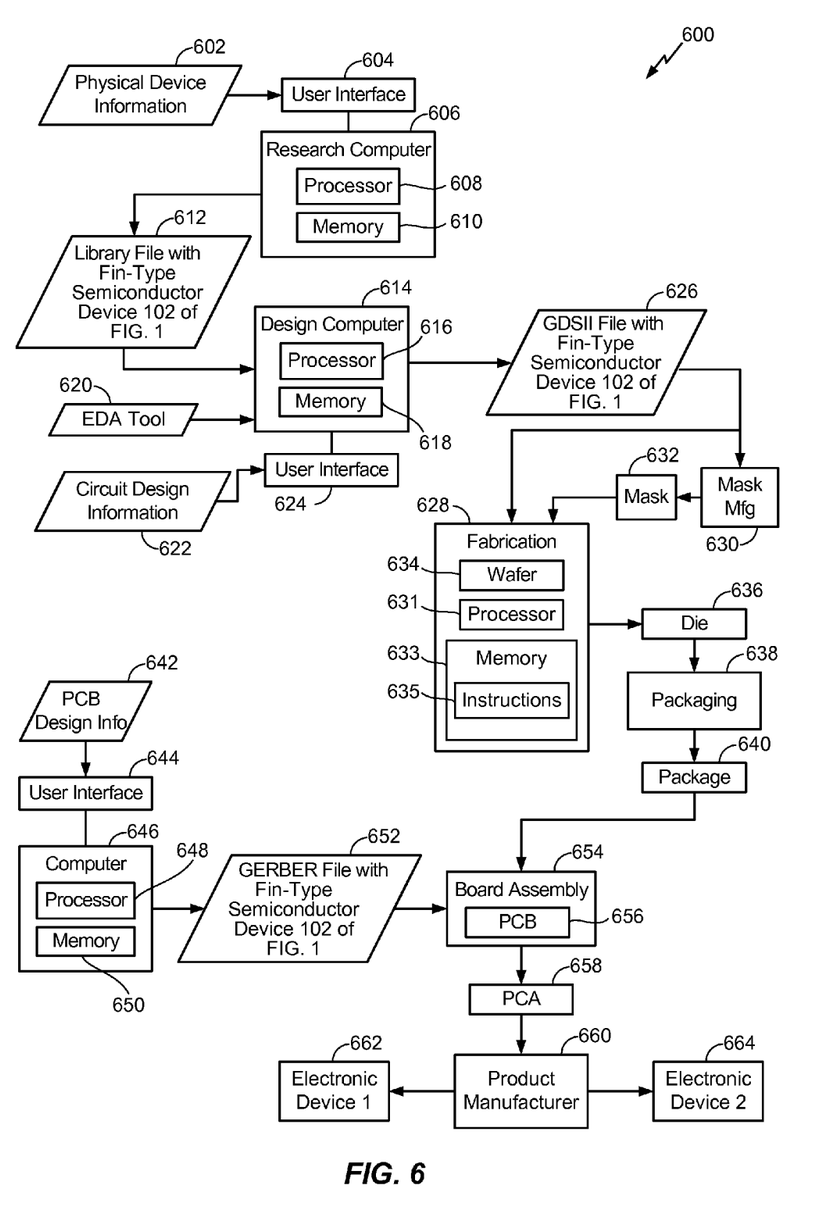
FIG. 6 is a data flow diagram of a particular illustrative embodiment of a manufacturing process to manufacture a fin-type semiconductor device with fins having different effective fin heights.

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include semiconductor wafers that are then cut into semiconductor dies and packaged into one or more semiconductor chips. The chips are then employed in devices described above. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as the fin-type semiconductor device 102 of FIG. 1. For example, the physical device information 602 may include physical parameters, material characteristics, and structure information that is entered via a user interface 604 coupled to the research computer 606. The research computer 606 includes a processor 608, such as one or more processing cores, coupled to a computer-readable medium such as a memory 610. The memory 610 may store computer-readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including the fin-type semiconductor device 102 of FIG. 1 and may be provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor-executable instructions at the memory 618 to enable a user of the design computer 614 to design a circuit including the fin-type semiconductor device 102 of FIG. 1, of the library file 612. For example, a user of the design computer 614 may enter circuit design information 622 via a user interface 624 coupled to the design computer 614. The circuit design information 622 may include design information representing at least one physical property of a semiconductor device, such as the fin-type semiconductor device 102 of FIG. 1. To illustrate, the circuit design property may include identification of particular circuits and relationships to other elements in a circuit design, positioning information, feature size information, interconnection information, or other information representing a physical property of the semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format (e.g., a GDSII format). The design computer 614 may be configured to generate a data file including the transformed design information, such as a GDSII file 626 that includes information describing the fin-type semiconductor device 102 of FIG. 1, in addition to other circuits or information. To illustrate, the data file may include information corresponding to a system-on-chip (SOC) that includes the fin-type semiconductor device 102 of FIG. 1, and that may also include additional electronic circuits and components within the SOC.

The GDSII file 626 may be received at a fabrication process 628 to manufacture a wafer including the fin-type semiconductor device 102 of FIG. 1, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, such as a silicon on insulator (SOI) wafer, a silicon on silicon (SOS) wafer, or a bulk silicon wafer.

In a particular embodiment, the fabrication process 628 may be initiated or controlled by a processor 631 and a memory 633. The memory 633 (e.g., a non-transitory computer-readable medium) may include instructions 635 that are executable by the processor 631. For example, the computer-executable instructions may be executable to cause the processor 631 to initiate or control formation of a fin-type semiconductor device having different effective fin heights. To illustrate, the instructions may be executable by the processor 631 to initiate or control operation of one or more tools or processes that form the fin-type semiconductor device, components thereof, or components attached thereto (e.g., etch stop layer(s), compound layer(s), FinFET(s), fin(s), etc.).

The fabrication process 628 may be performed by a fabrication system that is fully automated or partially automated. For example, the fabrication process 628 may be automated and steps of the fabrication process 628 may be performed according to a schedule. The fabrication system may include fabrication equipment (e.g., processing tools) to perform one or more operations to form a device, such as the fin-type semiconductor device 102 of FIG. 1. For example, the fabrication equipment may be configured to form a first etch stop layer, a first compound layer, a second etch stop layer, a second compound layer, a first fin, a first fin layer, an intermediate layer, a second fin layer, a second fin, etc.

The fabrication system (e.g., an automated system that performs the fabrication process 628) may have a distributed architecture (e.g., a hierarchy). For example, the fabrication system may include one or more processors, such as the processor 631, one or more memories, such as the memory 633, and/or controllers that are distributed according to the distributed architecture. The distributed architecture may include a high-level processor that controls or initiates operations of one or more low-level systems. For example, a high-level portion of the fabrication system that controls or performs the fabrication process 628 may include one or more processors, such as the processor 631, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status information to the high-level system. Each of the one or more low-level systems may be associated with one or more corresponding pieces of fabrication equipment (e.g., processing tools). In a particular embodiment, the fabrication system may include multiple processors that are distributed. For example, a controller of a low-level system component of the fabrication system may include a processor, such as the processor 631.

Alternatively, the processor 631 may be a part of a high-level system, subsystem, or component of the fabrication system. In another embodiment, the processor 631 includes distributed processing at various levels and components of a fabrication system. Thus, the processor 631 may include or execute processor-executable instructions that cause the processor 631 to initiate or control formation of a device, such as the fin-type semiconductor device 102 of FIG. 1. For example, etch stop layer(s) may be formed by one or more deposition tools or one or more plating platforms, platers, or other plating equipment configured to form an etch stop layer in a device. As another example, compound layer(s) may be formed by one or more deposition tools or a "bottom up" fabrication tool, such as a chemical vapor deposition tool or a spin-on fabrication tool. As yet another example, fins may be formed from etch stop layer(s) and compound layer(s) by one or more etchers, such as a wet etcher, a dry etcher, or a plasma etcher, or one or more dissolving tools.

The executable instructions stored in the memory 633 may enable the processor 631 to initiate and control formation of a device, such as the fin-type semiconductor device 102 of FIG. 1, by performing operations as described by the methods 300-400 of FIGS. 3-4.

The die 636 may be provided to a packaging process 638, where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor-executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the fin-type semiconductor device 102 of FIG. 1.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the fin-type semiconductor device 102 of FIG. 1. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 758.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a set top box, a music player, a video player, an entertainment unit, a navigation device, a communications device, a personal digital assistant (PDA), a fixed location data unit, and a computer, into which the fin-type semiconductor device 102 of FIG. 1 is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the fin-type semiconductor device 102 of FIG. 1, may be fabricated, processed, and incorporated into an electronic device, as described in the illustrative process 600. One or more aspects of the embodiments disclosed with respect to FIGS. 1-6 may be included at various processing stages, such as within the library file 612, the GDSII file 626, and the GERBER file 652, as well as stored at the memory 610 of the research computer 606, the memory 618 of the design computer 614, the memory 633 of a computer associated with the fabrication process 628, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

In conjunction with the described embodiments, an apparatus may include a substrate and a fin-type semiconductor device extending from the substrate. The fin-type semiconductor device may include means for providing a first fin-type conduction channel. The means for providing a first fin-type conduction channel may include a first fin field effect transistor (FinFET) device extending from a surface of a first etch stop layer. The fin-type semiconductor device may also include means for providing a second fin-type conduction channel. The means for providing a second fin-type conduction channel may include a second FinFET device extending from a surface of a second etch stop layer, where a first compound layer is interposed between the first etch stop layer and the second etch stop layer.

In conjunction with the described embodiments, a method is disclosed that may include a first step of forming a first fin field effect transistor (FinFET) device that extends from a surface of a first etch stop layer. For example, the first step of forming the first FinFET device may include one or more processes described by the methods 300-400 of FIGS. 3-4, a deposition process, a lithography process, an etch process, one or more other processes configured to form a FinFET device extending from a surface of an etch stop layer, or any combination thereof. The method may also include a second step of forming a second FinFET device that extends from a surface of a first region of a second etch stop layer, where a first compound layer is interposed between the first etch stop layer and the second etch stop layer. For example, the second step of forming the second FinFET device may include one or more processes described by the methods 300 and 400 of FIGS. 3 and 4, a deposition process, a lithography process, an etch process, one or more other processes configured to form a FinFET device that extends from a surface of a first region of a second etch stop layer, or any combination thereof.

Although one or more of FIGS. 1-6 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry. Embodiments of the disclosure may also be employed in a standalone device (e.g., a standalone capacitor).

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor-executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a first fin field effect transistor (FinFET) device having an aspect ratio of at least 3 and extending from a surface of a first etch stop layer, the first FinFET device including a first fin comprising a first fin layer, a second fin layer on the first etch stop layer, and an intermediate layer between the first fin layer and the second fin layer, wherein the first fin layer and the second fin layer comprise a first compound material, and wherein the intermediate layer comprises a second compound material comprising a II-VI or III-V compound material; and
a second FinFET device having an aspect ratio of less than 3 and extending from a surface of a second etch stop layer that is separated from the first etch stop layer by a compound layer.

2. The apparatus of claim 1, wherein:
the first FinFET device further includes:
a first metal gate; and
a first oxide layer in contact with the first fin layer, the second fin layer, and the intermediate layer; wherein the second FinFET device includes:
a second metal gate;
a second oxide layer; and
a second fin in contact with the second oxide layer, wherein the second fin comprises the first compound material, and wherein the second etch stop layer comprises the second compound material.

3. The apparatus of claim 2, wherein the first FinFET device has a first fin height defined by the first fin layer and the second fin layer, wherein the second FinFET device has a second fin height defined by the second fin, and wherein the first fin height is different than the second fin height.

4. The apparatus of claim 1, wherein the first etch stop layer and the second etch stop layer comprise the second compound material.

5. The apparatus of claim 1, wherein the intermediate layer comprises a first III-V compound, and wherein the first fin layer and the second fin layer comprise a second III-V compound that has a lower band gap energy than the first III-V compound.

6. The apparatus of claim 5, wherein the first III-V compound includes aluminum arsenide, and wherein the second III-V compound includes gallium arsenide.

7. The apparatus of claim 5, wherein the first III-V compound includes indium aluminum arsenide, and wherein the second III-V compound includes indium gallium arsenide.

8. The apparatus of claim 1, wherein the intermediate layer comprises a first II-VI compound, and wherein the first fin layer and the second fin layer comprise a second II-VI compound that has lower band gap energy than the first II-VI compound.

9. The apparatus of claim 8, wherein the first II-VI compound includes Zinc telluride (ZnTe), and wherein the second II-VI compound includes Cadmium telluride (CdTe).

10. The apparatus of claim 1, wherein the second compound material has a higher band gap energy than the first compound material.

11. The apparatus of claim 1, wherein the intermediate layer and the second etch stop layer comprise the second compound material.

12. The apparatus of claim 1, wherein the compound layer comprises the first compound material.

13. The apparatus of claim 1, wherein the first etch stop layer and the second etch stop layer are aluminum arsenide layers that control respective effective fin heights of the first FinFET and the second FinFET.

14. A method of forming a semiconductor device, the method comprising:
    forming a first fin field effect transistor (FinFET) device having an aspect ratio of at least 3 that extends from a surface of a first etch stop layer, the first FinFET device including a first fin comprising a first fin layer, a second fin layer on the first etch stop layer, and an intermediate layer between the first fin layer and the second fin layer, wherein the first fin layer and the second fin layer comprise a first compound material, and wherein the intermediate layer comprises a second compound material comprising a II-VI or III-V compound material; and
    forming a second FinFET device having an aspect ratio of less than 3 that extends from a surface of a second etch stop layer that is separated from the first etch stop layer by a first compound layer.

15. The method of claim 14, further comprising:
    forming the first etch stop layer on a surface of a substrate;
    forming the first compound layer on the surface of the first etch stop layer;
    forming the second etch stop layer on a surface of the first compound layer; and
    forming a second compound layer on a surface of the second etch stop layer.

16. The method of claim 15, further comprising:
    patterning the second compound layer to form the first fin layer of the first fin of the first FinFET device and to form a second fin of the second FinFET device;
    patterning the second etch stop layer to form the intermediate layer of the first fin; and
    patterning the first compound layer to form the second fin layer of the first fin.

17. The method of claim 16, wherein the first FinFET device includes:
    a first metal gate; and
    a first oxide layer in contact with the first fin layer, the second fin layer, and the intermediate layer;
    wherein the second FinFET device includes:
    a second metal gate;
    a second oxide layer; and
    the second fin in contact with the second oxide layer, wherein the second fin comprises the first compound material, and wherein the second etch stop layer comprises the second compound material.

18. The method of claim 17, wherein the first FinFET device has a first fin height defined by the first fin layer and the second fin layer, and wherein the second FinFET device has a second fin height defined by the second fin.

19. The method of claim 18, wherein the first fin height is different than the second fin height.

20. The method of claim 14, wherein the first etch stop layer and the second etch stop layer are formed using the same material.

21. The method of claim 14, wherein the intermediate layer is formed using a first III-V compound, and wherein the first fin layer and the second fin layer are formed using a second III-V compound that has a lower band gap energy than the first III-V compound.

22. The method of claim 21, wherein the first III-V compound includes aluminum arsenide, and wherein the second III-V compound includes gallium arsenide.

23. The method of claim 14, wherein the intermediate layer is formed using a first II-VI compound, and wherein the first fin layer and the second fin layer are formed using a second II-VI compound that has lower band gap energy than the first II-VI compound.

24. The method of claim 23, wherein the first II-VI compound includes Zinc telluride (ZnTe) and wherein the second II-VI compound includes Cadmium telluride (CdTe).

25. An apparatus comprising:
    a substrate; and
    a fin-type semiconductor device extending from the substrate, the fin-type semiconductor device comprising:
        means for providing a first fin-type conduction channel, the means for providing a first fin-type conduction channel comprising a first fin field effect transistor (FinFET) device having an aspect ratio of at least 3 and extending from a surface of a first etch stop layer, the first FinFET device including a first fin comprising a first fin layer, a second fin layer on the first etch stop layer, and an intermediate layer between the first fin layer and the second fin layer, wherein the first fin layer and the second fin layer comprise a first compound material, and wherein the intermediate layer comprises a second compound material comprising a II-VI or III-V compound material; and
        means for providing a second fin-type conduction channel, the means for providing a second fin-type conduction channel comprising a second FinFET device having an aspect ratio of less than 3 and extending from a surface of a second etch stop layer that is separated from the first etch stop layer by a compound layer.

26. A computer-readable storage device storing instructions that are executable by a processor to perform operations comprising:
    initiating formation of a first fin field effect transistor (FinFET) device having an aspect ratio of at least 3 that extends from a surface of a first etch stop layer, the first FinFET device including a first fin comprising a first fin layer, a second fin layer on the first etch stop layer, and an intermediate layer between the first fin layer and the second fin layer, wherein the first fin layer and the second fin layer comprise a first compound material, and wherein the intermediate layer comprises a second compound material comprising a II-VI or III-V compound material; and
    initiating formation of a second FinFET device having an aspect ratio of less than 3 that extends from a surface of a second etch stop layer that is separated from the first etch stop layer by a first compound layer.

27. The computer-readable storage device of claim 26, wherein the operations further comprise:
- initiating formation of the first etch stop layer on a surface of a substrate;
- initiating formation of the first compound layer on the surface of the first etch stop layer;
- initiating formation of the second etch stop layer on a surface of the first compound layer; and
- initiating formation of a second compound layer on a surface of the second etch stop layer.

28. The computer-readable storage device of claim 27, wherein the operations further comprise:
- initiating patterning of the second compound layer to form the first fin layer of the first fin of the first FinFET device and to form a second fin of the second FinFET device;
- initiating patterning of the second etch stop layer to form the intermediate layer of the first fin; and
- initiating patterning of the first compound layer to form the second fin layer of the first fin.

* * * * *